(12) United States Patent
Washino et al.

(10) Patent No.: US 7,687,295 B2
(45) Date of Patent: Mar. 30, 2010

(54) METHOD FOR MANUFACTURING OPTICAL SEMICONDUCTOR DEVICE

(75) Inventors: Ryu Washino, Chigasaki (JP); Susumu Sorimachi, Komoro (JP); Daisuke Nakai, Yokohama (JP); Kaoru Okamoto, Yokohama (JP); Shigenori Hayakawa, Atsugi (JP)

(73) Assignee: Opnext Japan, Inc. (JP)

( * ) Notice: Subject to any disclaimer, the term of this patent is extended or adjusted under 35 U.S.C. 154(b) by 13 days.

(21) Appl. No.: 12/023,177

(22) Filed: Jan. 31, 2008

(65) Prior Publication Data
US 2008/0203404 A1    Aug. 28, 2008

(30) Foreign Application Priority Data

Feb. 27, 2007    (JP)    ............................. 2007-047352
May 18, 2007    (JP)    ............................. 2007-133059

(51) Int. Cl.
*H01L 21/00* (2006.01)
*H01L 29/26* (2006.01)
(52) U.S. Cl. ......................................... 438/46; 257/80
(58) Field of Classification Search ................... 257/98, 257/99, 100, 40, E33.059, E33.069, 80; 372/46.01, 372/50.11, 50.124, 87; 438/46
See application file for complete search history.

(56) References Cited

U.S. PATENT DOCUMENTS

2004/0218646 A1    11/2004    Mihashi et al.
2006/0081868 A1    4/2006    Kotani
2006/0262824 A1    11/2006    Kaneko
2006/0274800 A1*    12/2006    Kaneko .................... 372/43.01

FOREIGN PATENT DOCUMENTS

| EP | 0 222 395 | 5/1987 |
| EP | 1 615 305 | 1/2006 |
| JP | 59-165473 | 3/1983 |
| JP | 2005-175382 | 12/2003 |
| TW | 1234914 B | 6/2005 |

* cited by examiner

*Primary Examiner*—Thomas L Dickey
*Assistant Examiner*—Nikolay Yushin
(74) *Attorney, Agent, or Firm*—Antonelli, Terry, Stout & Kraus, LLP.

(57) ABSTRACT

In an optical semiconductor device that emits or receives light substantially perpendicularly to or in parallel to an active surface formed on a semiconductor substrate, the optical semiconductor device, an electrode that is formed on the active surface side and connected to the active surface is stepped or tapered at an end of the electrode. The electrode of the optical semiconductor device is formed of three layers including an adhesive layer, a diffusion prevention layer, and an Au layer, and the stepped configuration or the taped configuration is formed by a difference of the thickness of the Au layer or the thickness of the adhesive layer/diffusion prevention layer/Au layer.

2 Claims, 6 Drawing Sheets

METHOD FOR MANUFACTURING OPTICAL SEMICONDUCTOR DEVICE

CLAIM OF PRIORITY

The present application claims priority from Japanese patent application serial nos. 2007-047352, filed on Feb. 27, 2007, and 2007-133059, filed on May 18, 2007, the contents of which are hereby incorporated by references into this application.

BACKGROUND OF THE INVENTION

The present invention relates to an optical semiconductor device such as a light emitting semiconductor device and a light receiving semiconductor device, and more particularly to an optical semiconductor device that is excellent in reliability.

A semiconductor laser device of a background art will be described with reference to FIGS. 1 to 3. In this example, FIG. 1 is a perspective view showing a semiconductor laser device. FIGS. 2 and 3 are cross-sectional views showing a semiconductor laser device.

Referring to FIG. 1, in the semiconductor laser device, electrode capacitance adjustment PADs 30 are formed on the right and left sides of a stripe 60 including an active layer formed on an InP substrate 10. After a passivation layer 40 not shown has been formed, through-holes are formed on the stripe 60. Further, after an electrode layer 20 has been formed, the electrode layer 20 is photo-etched to form a p-electrode at a right side of FIG. 1. Although not shown in the figure, the n-electrode is formed on a rear surface (lower surface) of the InP substrate 10 after the rear surface of the InP substrate 10 has been polished.

An electrode at the left side of FIG. 1 is of a float potential and is formed in order to facilitate the handling of the semiconductor laser device. Also, laser oscillates at a lower portion of the stripe 60, and is output toward an anteroposterior direction. The output ratio is determined by reflective layers not shown which are disposed on the end surfaces.

FIG. 2 is a cross-sectional view taken along a broken line in FIG. 1. In the present specification, the cross section is not hatched. This is because the complication of the drawing is prevented. As described in FIG. 1, the PAD 30 is formed on the lower portion of the p-electrode and the float electrode. The passivation layer 40 covers the entire active surface of the semiconductor laser device, and is opened above a mesa 50 that is a part of the stripe 60 to obtain an electric connection between the mesa 50 and the electrode layer 20.

FIG. 3 is a cross-sectional view showing a hithermost portion (output terminal) of FIG. 1. In the semiconductor laser device, the electrode layer 20 covers the entire surface of the stripe 60 at the output terminal. Electrode layer terminals 20b are formed at both side positions apart from the mesa 50 having a width of about 1 μm by several to ten μm by ion milling. The positions of the electrode layer terminals 20b are designed from their capacitance. In this example, each of the electrode layers 20 is a deposited layer made of Ti/Pt/Au, and its thickness is 150 nm/40 nm/750 nm. Also, Ti is for securing adhesion with a substrate, Pt is for stopping the diffusion of Au into the substrate, and Au is for a current layer and wire bonding. A stress develops in the electrode layer 20 when the layer grows, and remains in the layer. The stress becomes maximum at the electrode layer ends 20b which are discontinuous points. The thickness of the InP substrate 10 whose rear surface has been polished is 90 μm which is thin. On the other hand, the stress of the electrode layer 20 is a tension stress of GPa order. As a result, the stress of the electrode layer 20 distorts the InP substrate 10 in a convex shape (the electrode layer surface is inside) downward. In the present specification, the description of Ti/Pt/Au means that Ti is the lowest (InP substrate side), and Au is the uppermost.

According to the inventors' study, the distortion affects the distribution of electrons and holes below the mesa 50 to be thickened or thinned in the longitudinal direction (a vertical direction on the paper plane). As a result, the current density when laser oscillates is increased, and crystal may be destroyed by concentration of a developed heat. Since the semiconductor laser device oscillates the laser in a state of a laser module attached to a heat sink, the distortion is corrected. However, it is necessary to take the measures against the crystal destruction.

SUMMARY OF THE INVENTION

The present invention has been made to solve the above problems, and therefore an object of the present invention is to provide an optical semiconductor device which eliminates the crystal destruction caused by a stress of an electrode layer and is excellent in reliability.

The above object can be achieved by an optical semiconductor device in which an electrode that emits light or receives the light substantially perpendicularly to or in parallel to an active surface that is formed on a semiconductor substrate, is formed on the active surface side, and is connected to the active surface, has a step configuration at its end.

BRIEF DESCRIPTION OF THE DRAWINGS

Preferred embodiments of the present invention will now described in conjunction with the accompanying drawings, in which.

DETAILED DESCRIPTION OF THE PREFERRED EMBODIMENTS

Figure 1:
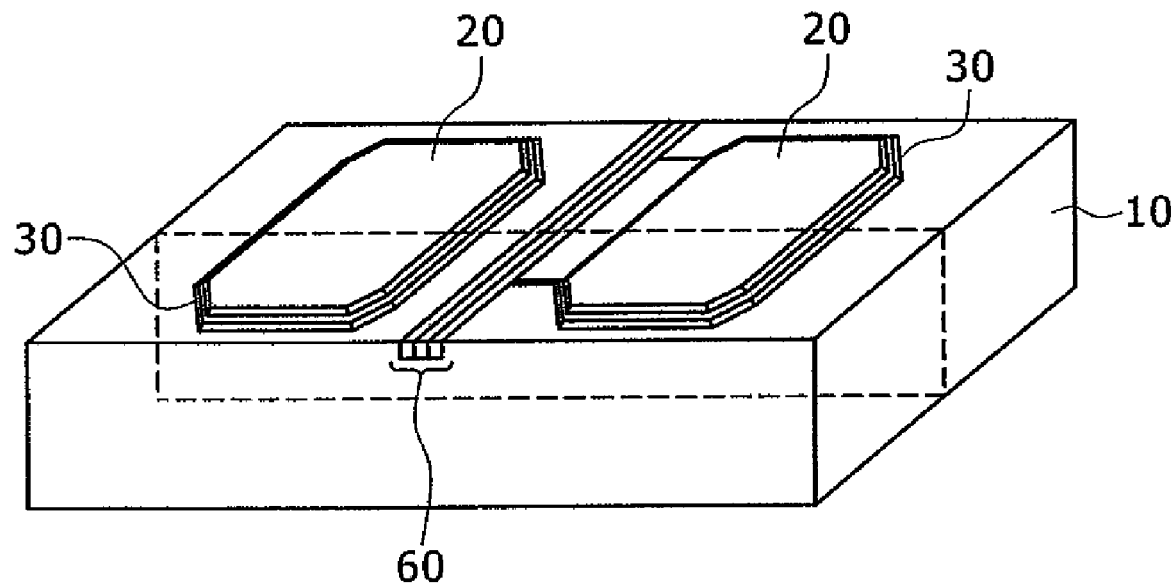
FIG. 1 is a perspective view showing a semiconductor laser device.
Figure 2:
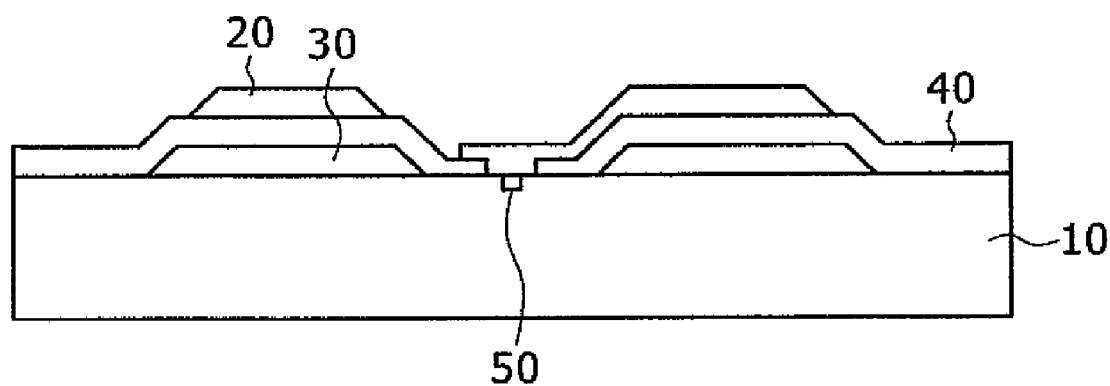
FIG. 2 is a cross-sectional view showing the semiconductor laser device.
Figure 3:
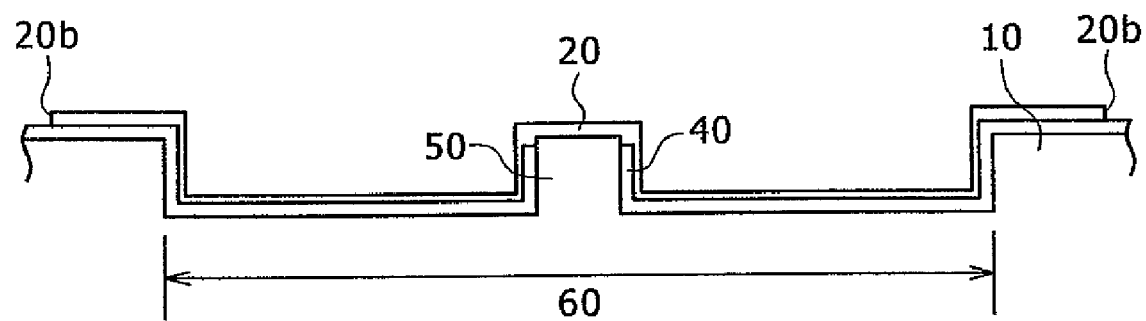
FIG. 3 is a cross-sectional view showing a portion of an output end of the semiconductor laser device.

Hereinafter, a description will be given of embodiments of the present invention with reference to the accompanying drawings. The substantially same parts are denoted by identical reference numerals, and the duplex description will be omitted.

First Embodiment

Figure 4:
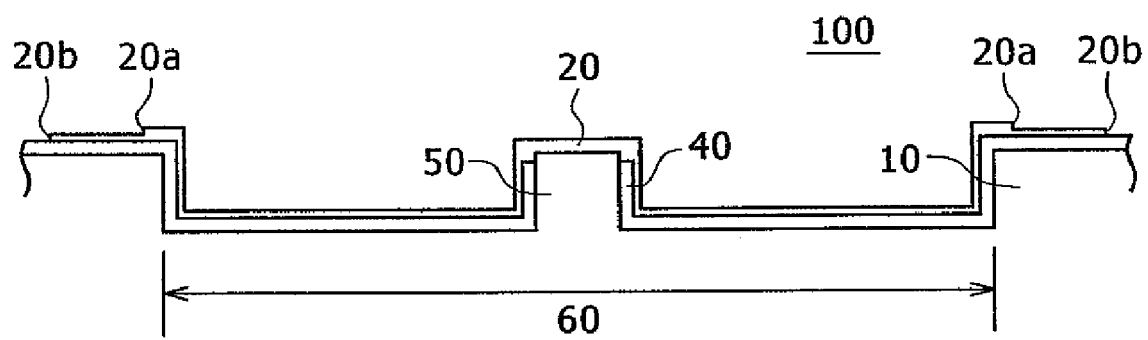
FIG. 4 is a cross-sectional view showing the portion of the output end of the semiconductor laser device.

A description will be given of a first embodiment with reference to FIGS. 4 to 6. FIG. 4 is a cross-sectional view showing the portion of the output end of the semiconductor laser device. FIGS. 5A to 5E are diagrams for explaining a fabricating process of the semiconductor laser device. FIG. 6 is a block diagram showing an optical transmitter module to which the semiconductor laser device is applied.

Referring to FIG. 4, in a semiconductor laser device 100, an electrode layer 20 covers the entire surface of a stripe 60 at its output end. Electrode layer terminals 20b are formed at both side positions apart from a mesa 50 having a width of about 1 µm by several to ten µm by ion milling. However, the metalized layer of the electrode end 20b is formed of two layers of Ti/Pt. Also, an Au layer of the electrode layer 20 extends up to the Au electrode layer end 20a inside of the electrode end 20b by 1 to 3 µm. The reason that the above configuration is applied is because a stress of Ti, Pt, and Au which constitute the electrode layer 20 is not concentrated on the electrode layer end 20b, and the Ti/Pt layer functions as a stress relaxation layer in the Au electrode layer end 20a that is largest in the layer thickness and large in the stress.

Figure 5A:
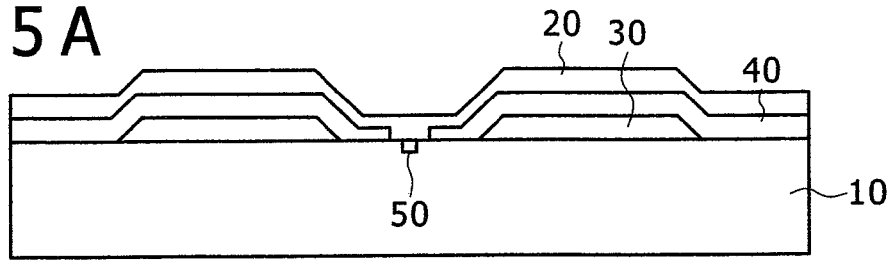
FIGS. 5A to 5E are diagrams for explaining a fabricating process of the semiconductor laser device, respectively.
Figure 5B:
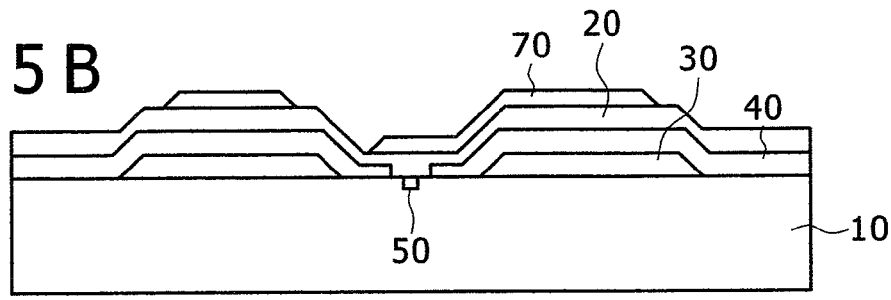
Figure 5C:
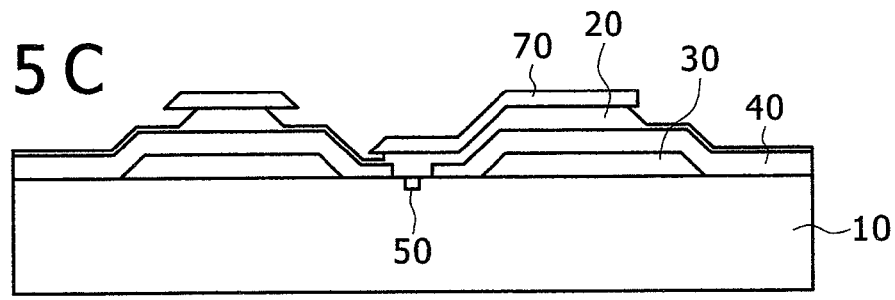
Figure 5D:
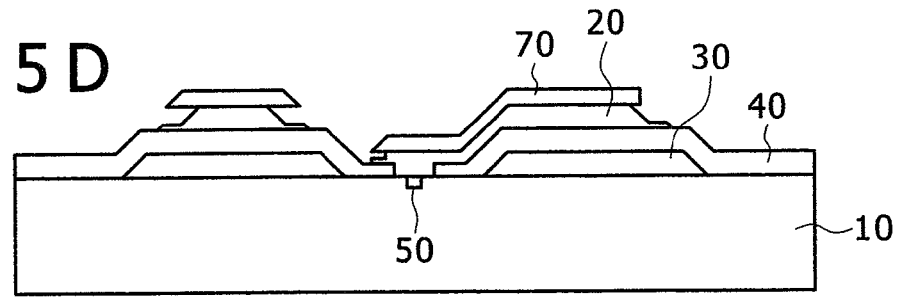
Figure 5E:
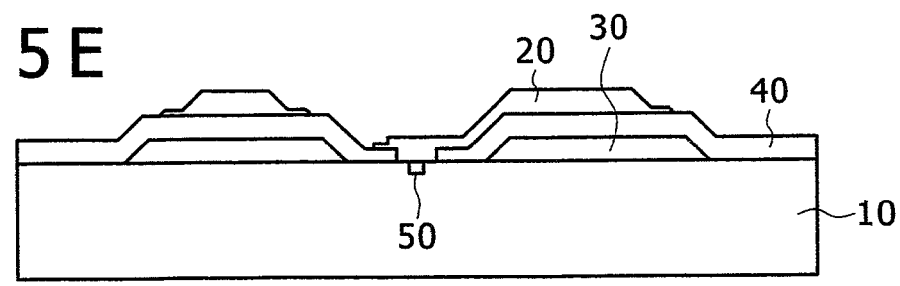
Figure 6:
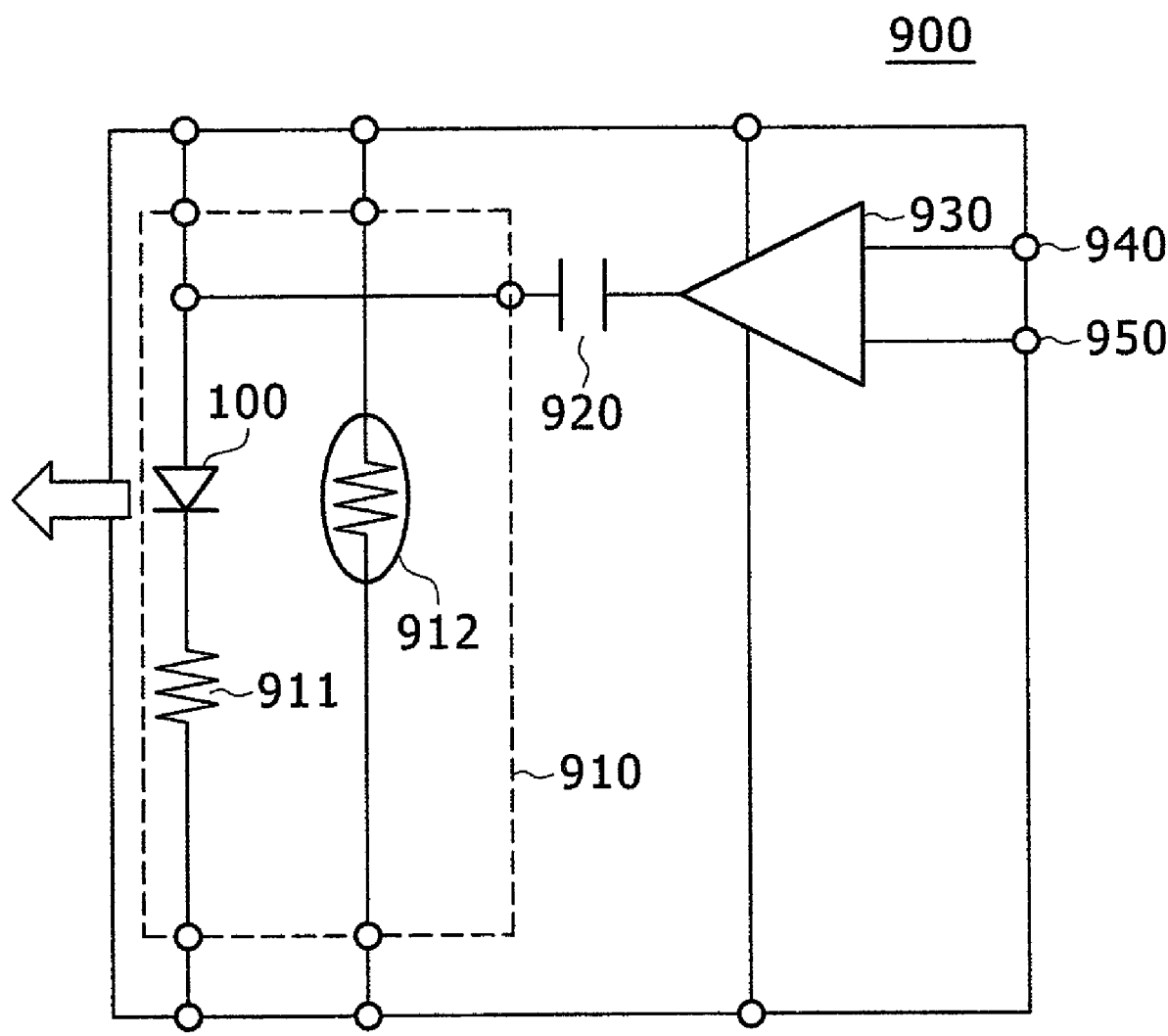
FIG. 6 is a block diagram showing an optical transmitter module to which the semiconductor laser device is applied.

Referring to FIGS. 5A to 5E, the fabricating process of the Au electrode layer end 20a in FIG. 4 will be described. FIG. 5A is a cross-sectional view showing the main portion of the fabricating process after Ti/Pt/Au has been deposited on the substrate. FIG. 5B is a cross-sectional view showing the main portion of the fabricating process after an electrode etching photoresist pattern has been formed. FIG. 5C is a cross-sectional view showing the main portion of the fabricating process after Au wet etching has been conducted. FIG. 5D is a cross-sectional view showing the main portion of the fabricating process after Ti/Pt dry etching has been conducted. FIG. 5E is a cross-sectional view showing the main portion of the fabricating process after a photoresist has been stripped.

Referring to FIG. 5A, Ti/Pt/Au is deposited in a range of 10 nm to 1 µm as the electrode layer 20. In this example, 150 nm/40 nm/750 nm is deposited, respectively. After a photoresist pattern 70 has been formed in FIG. 5B, Au is etched with an aqueous solution of iodine and ammonium iodide in FIG. 5C. In this example, the aqueous solution containing the aqueous solution of iodine and ammonium iodide can selectively etch Au or Pt. The etching does not stop at a just etch but stops after etching is advanced up to a lower portion of the photoresist 70 by about 1 to 3 µm. In FIG. 5D, Ti/Pt is etched by the aid of the same photoresist through ion milling. In this example, etching conducted by ion milling is anisotropic, and no etching is advanced in a lateral direction. As a result, as shown in FIG. 5E, the entire outer periphery of the electrode layer 20 is of a two-stage structure including a Ti/Pt portion and a Ti/Pt/Au portion. Since the Au electrode layer end 20a is put on Ti/Pt, a stress is reduced by Ti/Pt. As a result, the stress is not concentrated on the electrode layer end 20b and the Au layer end 20a in the vicinity of the mesa 50.

According to the above embodiment, there can be obtained the semiconductor laser device that is excellent in reliability. The electrode layer that is formed on an active layer through a passivation layer is not limited to Ti/Pt/Au but can be made of Ti/Mo/Au. Also, the thicknesses of the respective layers of the electrode layer are not limited to the above embodiment. Also, the conductivity type can be inverted. The end surface light emission type is described as the semiconductor laser device, but the surface light emission type can be applied. Since the light receiving semiconductor device also uses an Au wiring, the light receiving semiconductor device of the end surface light receiving type or the surface light receiving type can be applied. In the present specification, the optical semiconductor device includes the light emitting semiconductor device and the light receiving semiconductor device.

In the above embodiment, the semiconductor laser device is described. Alternatively, the present invention can be applied to a semiconductor device having a wiring which includes at least an Au layer connected to an active layer through the through-hole of the passivation layer.

An optical transmission module 900 shown in FIG. 6 is made up of a laser module 910 and a driver circuit 930 that supplies a drive current to the laser module 910 through a capacitor element 920. The driver circuit 903 is supplied with a positive-phase electric signal from an IN1 terminal 940 and a reverse-phase electric signal from an IN2 terminal 950. Also, the laser module 910 is made up of a semiconductor laser device 100, a temperature monitor thermistor 912 of the semiconductor laser device 100 which is mounted on the same heat sink (not shown) as the semiconductor laser device 100, and a photoresistor element 911 that is connected to the cathode side of the semiconductor laser device 100. Also, a drive current from the driver circuit 903 is supplied to the anode of the semiconductor laser device 100. The laser element 100 of this embodiment is high in reliability because the electrode end is of the two-stage structure. As a result, the laser element 100 is high in reliability also as the laser module. Further, the laser element 100 is high in reliability also as the optical transmission module.

Second Embodiment

Figure 7A:
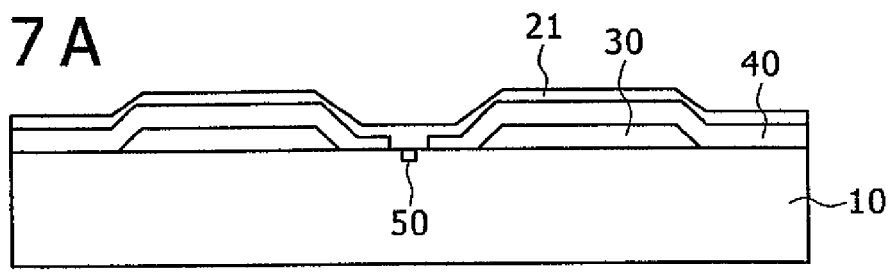
FIGS. 7A to 7E are diagrams for explaining another fabricating process of the semiconductor laser device, respectively.
Figure 7B:
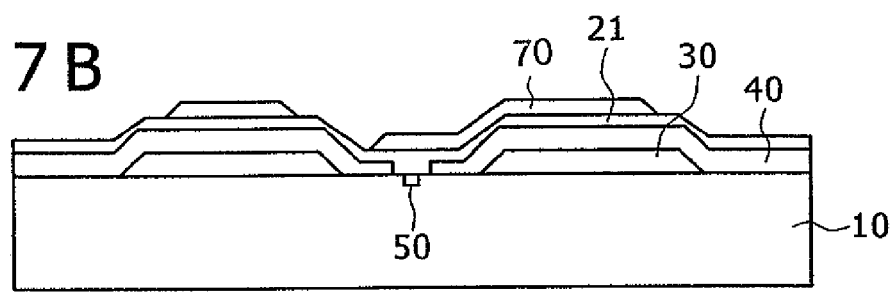
Figure 7C:
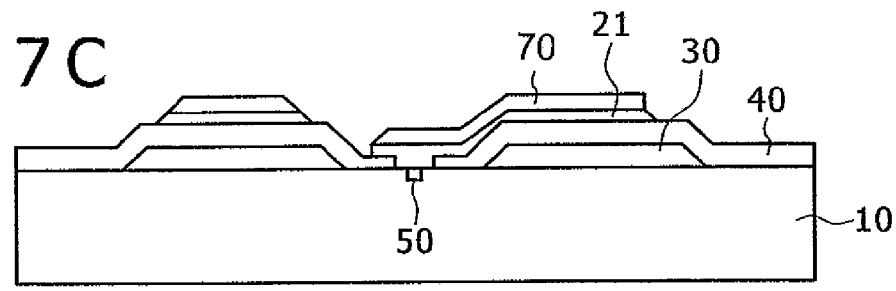
Figure 7D:
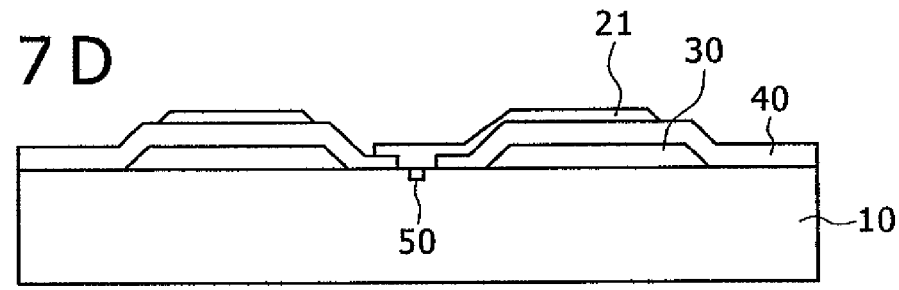
Figure 7E:
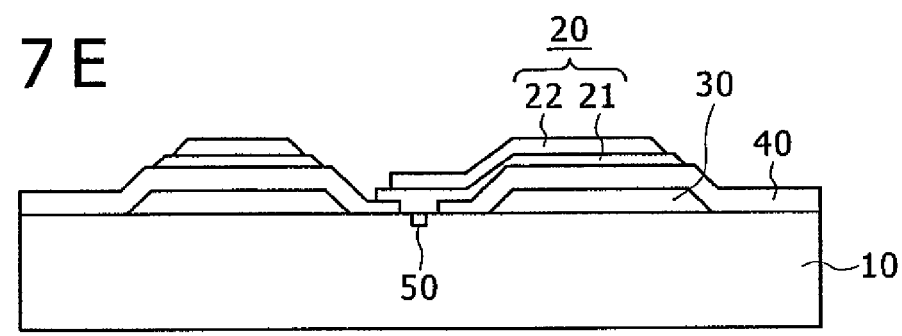

A second embodiment will be described with reference to FIGS. 7A to 7E. FIGS. 7A to 7E are diagrams for explaining the fabricating process of the semiconductor laser device, respectively. FIG. 7A is a cross-sectional view showing the main portion of the fabricating process after Ti/Pt/Au has been deposited on the layer. FIG. 7B is a cross-sectional view showing the main portion of the fabricating process after an electrode etching photoresist pattern has been formed. FIG. 7C is a cross-sectional view showing the main portion of the fabricating process after Ti/Pt/Au dry etching has been conducted. FIG. 7D is a cross-sectional view showing the main portion of the fabricating process after a photoresist has been stripped. FIG. 7E is a cross-sectional view showing the main portion of the fabricating process after an Au pattern has been formed by lift-off.

In FIG. 7A, Ti/Pt/Au is deposited in a range of 150 nm/40 nm/100 nm, respectively, as the electrode layer 21. After a photoresist pattern 70 has been formed in FIG. 7B, Ti/Pt/Au is etched by ion milling in FIG. 7C. In FIG. 7D, after the photoresist pattern 70 has been lifted off, a photoresist pattern not shown is formed, Au 22 of 650 nm is deposited, and Au layer is lifted off. As a result, as shown in FIG. 7E, the entire outer periphery of the electrode layer 20 is of a two-stage structure including a Ti/Pt/Au (100 nm) portion and a Ti/Pt/Au (750 nm) portion. As a result, the stress is not concentrated on the ends 20b and 20a of the electrode layer 20 in the vicinity of the mesa 50.

In FIG. 7A, Ti/Pt/Au is deposited in 150 nm/40 nm/100 nm, respectively. Au of 100 nm is provided for inhibited oxidation, and only Ti/Pt can be deposited in 150 nm/40 nm. In this case, Au of liftoff is 750 nm in thickness.

Also, it is preferable that the liftoff photoresist pattern not shown is formed in a reverse tapered configuration at the ends as will be described in FIGS. 8A to 8D. This is because Au deposition goes around the lower side of the photoresist pattern. As a result, the pattern ends of the deposited Au by liftoff are tapered, and the stress concentration is further reduced.

According to the above embodiment, there can be obtained the semiconductor laser device that is excellent in reliability. The electrode layer that is formed on an active layer through a passivation layer is not limited to Ti/Pt/Au but can be made of Ti/Mo/Au. Also, the thicknesses of the respective layers of the electrode layer are not limited to the above embodiment, but can be set to about 100 nm/25 nm/500 nm, or can be set to about 80 nm/20 nm/400 nm. Also, the conductivity type can be inverted. The end surface light emission type is described as the semiconductor laser device, but the surface light emission type can be applied. Since the light receiving semiconductor device also uses an Au wiring, the light receiving semiconductor device of the end surface light receiving type or the surface light receiving type can be applied. In the present specification, the optical semiconductor device includes the light emitting semiconductor device and the light receiving semiconductor device.

Further, as in the first embodiment, the semiconductor laser device that is high in reliability is used, thereby making it possible to provide a laser module that is high in reliability and an optical transmission module that is high in reliability. Also, there can be provided a light receiving module that is high in reliability.

Third Embodiment

Figure 8A:
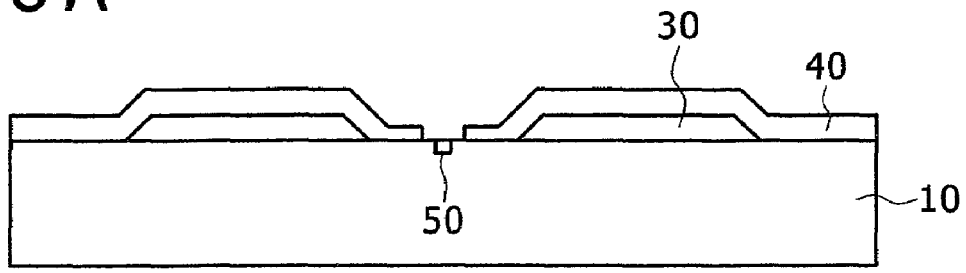
FIGS. 8A to 8D are diagrams for explaining still another fabricating process of the semiconductor laser device, respectively.
Figure 8B:
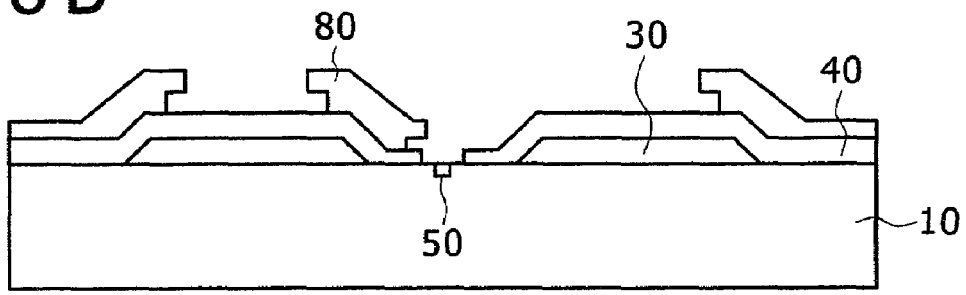
Figure 8C:
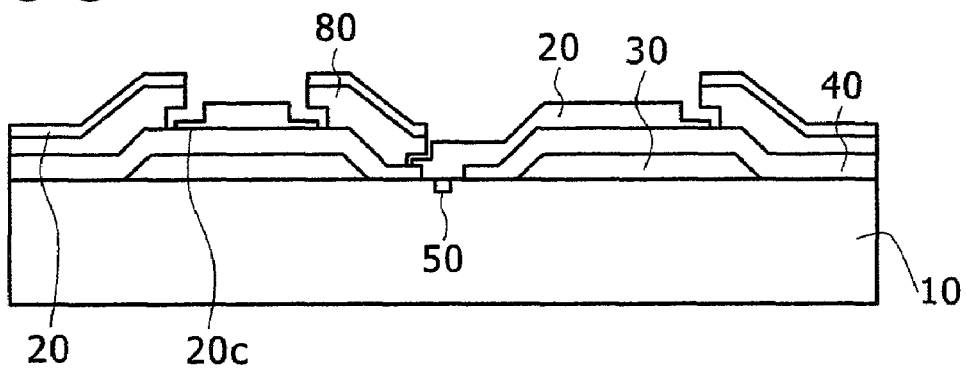
Figure 8D:
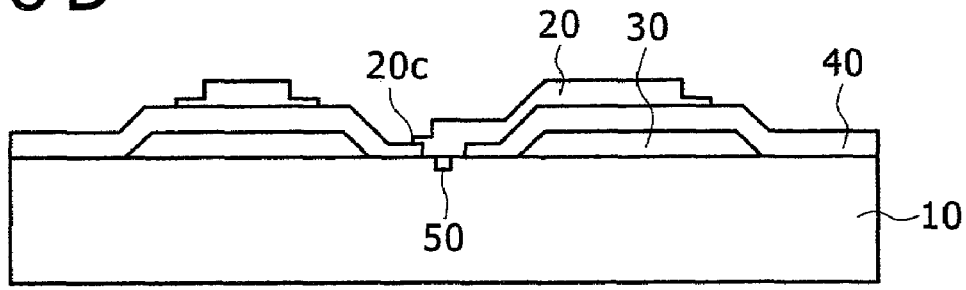

A third embodiment will be described with reference to FIGS. 8A to 8D. FIGS. 8A to 8D are diagrams for explaining the fabricating process of the semiconductor laser device. FIG. 8A is a cross-sectional view showing the main portion of the fabricating process after the through-holes have been formed. FIG. 8B is a cross-sectional view showing the main portion of the fabricating process after a liftoff photoresist pattern has been formed. FIG. 8C is a cross-sectional view showing the main portion of the fabricating process after Ti/Pt/Au has been deposited. FIG. 8D is a cross-sectional view showing the main portion of the fabricating process after the liftoff photoresist has been stripped.

Referring to FIG. 8A, a passivation layer 40 that is so formed as to cover the entire surface of the mesa 50 and the PAD 30 which have been formed on the InP substrate 10 has a through-hole formed on the mesa 50. In FIG. 8B, a photoresist pattern 80 is formed on the entire surface of the substrate 10 except for a position where the electrode pattern remains. The photoresist pattern 80 is provided for processing the electrode layer 20 through the liftoff method, and has a reverse taper or a reverse step formed at the ends. The reverse taper or the reverse step can be processed by patterning a two-stage photoresist in which a positive photoresist that is lower in sensitivity is formed on a positive photoresist that is higher in sensitivity by one exposure. A second layer that is lower in the solubility with respect to a developer is formed on a first layer that is higher in the solubility after exposure, thereby enabling the semiconductor laser device to be fabricated. In the latter case, no photosensitivity may be provided.

Referring to FIG. 8C, the electrode layer 20 is deposited by electron beam (EB). In this situation, the InP substrate 10 not only moves around an axis perpendicular to a deposition source but also rotates on its axis. The surface of the InP substrate 10 is deposited from all of the directions. As a result, in the interior of the reversely tapered or reversely stepped photoresist pattern 80 ends, the tapered or stepped end 20c is formed on the electrode layer 20. Also, the electrode layer 20 is also formed on the photoresist pattern 80. The electrode layer 20 is made of Ti/Pt/Au, and its thickness is 150 nm/40 nm/750 nm.

Referring to FIG. 8D, the photoresist pattern 80 is stripped to remove at the same time the electrode layer 20 that is formed on the photoresist pattern 80. Thus, the electrode pattern is formed through the liftoff method. The end 20c of the electrode 20 is tapered or stepped, and the thickness ratio of Ti/Pt/Au of the end 20c is about 4:1:19. As a result, the pattern end of the deposited Ti/Pt/Au due to the liftoff is tapered or stepped, thereby reducing the stress concentration.

According to the above embodiment, there can be obtained the semiconductor laser device that is excellent in reliability. The electrode layer that is formed on an active layer through a passivation layer is not limited to Ti/Pt/Au but can be made of Ti/Mo/Au. Also, the thicknesses of the respective layers of the electrode layer are not limited to the above embodiment, but can be set to about 100 nm/25 nm/500 nm, or can be set to about 80 nm/20 nm/400 nm. Also, the conductivity type can be inverted. The end surface light emission type is described as the semiconductor laser device but the surface light emission type can be applied. Since the light receiving semiconductor device also uses an Au wiring, the light receiving semiconductor device of the end surface light receiving type or the surface light receiving type can be applied. In the present specification, the optical semiconductor device includes the light emitting semiconductor device and the light receiving semiconductor device.

Also, as in the first embodiment, the semiconductor laser device that is high in reliability is used, thereby making it possible to provide a laser module that is high in reliability and an optical transmission module that is high in reliability. Also, there can be provided a light receiving module that is high in reliability.

According to the present invention, there can be provided the optical semiconductor device that is excellent in reliability.

What is claimed is:

1. A method for manufacturing an optical semiconductor device that transmits or receives optical signals substantially perpendicularly to or in parallel to an active surface formed on a semiconductor substrate, said method comprising the steps of:
    forming a photoresist pattern having a reverse taper or a reverse step formed at the ends, on the entire surface of the semiconductor substrate except for a position where an electrode pattern is to be deposited;
    depositing an electrode layer having a taper or a step formed at the ends by electron beam and the photoresist pattern; and
    stripping the photoresist pattern;
    wherein said reverse taper or said reverse step is processed by patterning a two-stage photoresist in which a second positive photoresist that is lower in sensitivity is formed on a first positive photoresist that is higher in sensitivity by one exposure.

2. The method for manufacturing the optical semiconductor device according to claim 1,
    wherein the tapered or the stepped ends of the electrode layer are processed by not only moving around a first axis perpendicular to a deposition source but also rotating on a second axis perpendicular to the semiconductor substrate.

* * * * *